United States Patent
Yan et al.

(10) Patent No.: US 11,522,100 B2
(45) Date of Patent: Dec. 6, 2022

(54) LIGHT-EMITTING DEVICE AND DISPLAY APPARATUS

(71) Applicants: KUNSHAN NEW FLAT PANEL DISPLAY TECHNOLOGY CENTER CO., LTD, Jiangsu (CN); KUNSHAN GO-VISIONOX OPTO-ELECTRONICS CO., LTD, Jiangsu (CN)

(72) Inventors: Mingzhe Yan, Kunshan (CN); Enqing Guo, Kunshan (CN)

(73) Assignees: Kunshan New Flat Panel Display Technology Center Co., Ltd, Kunshan (CN); KunShan Go-Visionox Opto-Electronics Co., Ltd, Kunshan (CN)

( * ) Notice: Subject to any disclaimer, the term of this patent is extended or adjusted under 35 U.S.C. 154(b) by 138 days.

(21) Appl. No.: 17/032,491

(22) Filed: Sep. 25, 2020

(65) Prior Publication Data

US 2021/0013370 A1 Jan. 14, 2021

Related U.S. Application Data

(63) Continuation of application No. PCT/CN2019/092565, filed on Jun. 24, 2019.

(30) Foreign Application Priority Data

Dec. 4, 2018 (CN) .......................... 201811475129.2

(51) Int. Cl.
*H01L 33/50* (2010.01)
*H01L 33/06* (2010.01)
(Continued)

(52) U.S. Cl.
CPC ............ *H01L 33/06* (2013.01); *H01L 27/156* (2013.01); *H01L 33/42* (2013.01); *H01L 33/504* (2013.01); *H01L 33/56* (2013.01)

(58) Field of Classification Search
CPC ....... B82Y 20/00; B82Y 30/00; H01L 27/156; H01L 33/06; H01L 33/42; H01L 33/501;
(Continued)

(56) References Cited

U.S. PATENT DOCUMENTS

2006/0152472 A1\* 7/2006 Nishiyama ............ G02F 1/1677
345/107
2015/0277204 A1\* 10/2015 Qu ...................... G02F 1/16757
977/774
(Continued)

FOREIGN PATENT DOCUMENTS

| CN | 101876771 A | 11/2010 |
|---|---|---|
| CN | 102044552 A | 5/2011 |

(Continued)

OTHER PUBLICATIONS

International Search Report dated Sep. 11, 2019 in corresponding International application No. PCT/CN2019/092565; 12 pages.
(Continued)

*Primary Examiner* — Matthew C Landau
*Assistant Examiner* — Dmitriy Yemelyanov
(74) *Attorney, Agent, or Firm* — Maier & Maier, PLLC

(57) ABSTRACT

Provided are a light-emitting device and a display apparatus. The light-emitting device includes: sub-pixels located on an array substrate, the sub-pixels each includes a first electrode and a second electrode that are disposed opposite to each other, and a quantum migrating layer between the first electrode and the second electrode. The quantum migrating layer includes a non-light-exiting region and a light-exiting region corresponding to a backlight source. Transparent
(Continued)

charged particles and quantum dots, which can be driven by an electric field to migrate in the light-exiting region and the non-light-exiting region, are encapsulated in an accommodating cavity of the quantum migrating layer. When there are quantum dots gathered in the light-exiting region, the quantum dots are excited to emit light; when there is no quantum dot in the light-exiting region, the light emitted by the backlight source directly passes and exits through the light-exiting region.

16 Claims, 6 Drawing Sheets

(51) Int. Cl.
*H01L 27/15* (2006.01)
*H01L 33/42* (2010.01)
*H01L 33/56* (2010.01)

(58) Field of Classification Search
CPC ..... H01L 33/504; H01L 33/507; H01L 33/56; H01L 33/508
See application file for complete search history.

(56) References Cited

U.S. PATENT DOCUMENTS

| | | | | |
|---|---|---|---|---|
| 2017/0138567 A1* | 5/2017 | Yoon | ............... | G02F 1/1335 |
| 2018/0155321 A1* | 6/2018 | Kim | ............... | G02F 1/1503 |
| 2019/0107765 A1* | 4/2019 | Whitehead | ............... | G02F 1/315 |

FOREIGN PATENT DOCUMENTS

| | | | | | |
|---|---|---|---|---|---|
| CN | 103926777 | A | | 7/2014 | |
| CN | 104007595 | A | | 8/2014 | |
| CN | 104377226 | A | | 2/2015 | |
| CN | 105511197 | A | | 4/2016 | |
| CN | 105590592 | A | | 5/2016 | |
| CN | 106773287 | A | | 5/2017 | |
| CN | 107579147 | A | | 1/2018 | |
| CN | 108165271 | A | | 6/2018 | |
| CN | 109188821 | A | * | 1/2019 | ......... G02F 1/13306 |
| JP | 2007121570 | A | | 5/2007 | |

OTHER PUBLICATIONS

Office Action dated Apr. 22, 2022, in connection with corresponding Chinese Application No. 201811475129.2; 5 pages.

* cited by examiner

LIGHT-EMITTING DEVICE AND DISPLAY APPARATUS

CROSS-REFERENCE TO RELATED APPLICATIONS

This application is a continuation of International Application No. PCT/CN2019/092565, filed on Jun. 24, 2019, which claims priority of Chinese Patent Application No. 201811475129.2, filed on Dec. 4, 2018, both of which are hereby incorporated by reference in their entireties.

TECHNICAL FIELD

The present disclosure relates to the field of display technologies and, in particular, to a light-emitting device and a display apparatus.

BACKGROUND

A quantum dot is a semiconductor in nanoscale. This nano-semiconductor material would emit light at a specific frequency by applying a specific light pressure thereto. With developments of synthesis technologies of the quantum dot, a luminous efficiency of a quantum dot-based light-emitting device may be as high as 100%. Moreover, by changing a size of the quantum dot or adding other element, a luminescence wavelength of the quantum dot can be regulated within all visible wave bands. In addition, a half-peak width of a luminescence spectrum of the quantum dot is relatively narrow, and is generally less than 30 nm, which satisfies an important condition for manufacturing a high-performance display apparatus. Due to many excellent properties of the quantum dot, quantum dot electroluminescent devices have attracted more and more attention. While how to realize color display by the quantum dot is very important for the light-emitting device.

SUMMARY

The present disclosure provides a light-emitting device and a display apparatus. According to a first aspect of the present disclosure, the present disclosure provides a light-emitting device, including an array substrate and a plurality of sub-pixels disposed on the array substrate, where each of the sub-pixels includes:

a first electrode;

a second electrode, disposed corresponding to the first electrode;

a quantum migrating layer, located between the first electrode and the second electrode and including a light-exiting region and a non-light-exiting region arranged in a same layer; and a backlight source, disposed between the array substrate and the quantum migrating layer, corresponding to the light-exiting region, and light emitted by the backlight source entering the light-exiting region;

where an accommodating cavity is disposed in the quantum migrating layer, and transparent charged particles and quantum dots, which can migrate in the light-exiting region and the non-light-exiting region, are encapsulated in the accommodating cavity.

Optionally, in an embodiment of the first aspect, a color of light emitted by the quantum dots is any one of red, green and blue, and the color of the light emitted by the quantum dots is different from a color of the light emitted by the backlight source.

Optionally, in an embodiment of the first aspect, each of the quantum dots includes a core, a shell layer and a modifying group.

Optionally, in another embodiment of the first aspect, the transparent charged particles are surface-modified metal oxide nanoparticles, and each of the surface-modified metal oxide nanoparticles has a particle diameter of greater than or equal to 10 nm and less than or equal to 100 nm.

Optionally, in another embodiment of the first aspect, the transparent charged particles are absorbed on surfaces of the quantum dots, or surround the quantum dots without being adsorbed.

Optionally, in still another embodiment of the first aspect, each of the surface-modified metal oxide nanoparticles includes:

a tungsten oxide, represented by a general formula $W_{y1}O_{z1}$, where y1 and z1 satisfy $2.2 \leq z1/y1 \leq 2.999$; and/or, a composite tungsten oxide, represented by a general formula $M_{x2}W_{y2}O_{z2}$ and having a hexagonal crystal structure, where M is one selected from a group consisting of H, He, an alkali metal, an alkaline earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I, where x2, y2 and z2 satisfy $0.001 \leq x2/y2 \leq 1.1$ and $2.2 \leq z2/y2 \leq 2.999$; and/or, an indium antimony oxide (abbreviated as IAO); and/or, an indium tin oxide (abbreviated as ITO).

Optionally, in further another embodiment of the first aspect, each of the surface-modified metal oxide nanoparticles has a surface coated with a polar ligand, and the polar ligand includes one of $NH_4$, $SO_3H$, COOH and a halogen.

Optionally, in further another embodiment of the first aspect, each of the sub-pixels further includes:

a third transparent electrode, located between the first electrode and the second electrode, where a first control electric field is formed between the third transparent electrode and the first electrode, a second control electric field is formed between the third transparent electrode and the second electrode, and the first control electric field and the second control electric field are in contrary directions.

Optionally, in further another embodiment of the first aspect, the third transparent electrode is located on a surface of the quantum migrating layer, and at least partially covers the light-exiting region.

Optionally, in further another embodiment of the first aspect, the third transparent electrode is embedded in the quantum migrating layer, and at least partially covers the light-exiting region.

Optionally, in further another embodiment of the first aspect, each of the sub-pixels further includes:

a light blocking layer, located on a surface of the quantum migrating layer and covering the non-light-exiting region.

Optionally, in further another embodiment of the first aspect, the light blocking layer is located on a surface of the quantum migrating layer close to the backlight source and/or a surface of the quantum migrating layer away from the backlight source.

Optionally, in further another embodiment of the first aspect, the light-exiting region is disposed in a middle position of the quantum migrating layer, or disposed in an edge area adjacent to the first electrode or the second electrode.

Optionally, in further another embodiment of the first aspect, the quantum migrating layer has a surfactant added thereto.

In a second aspect of the present disclosure, the present disclosure also provides a display apparatus, including: the light-emitting device described in the first aspect or any one of embodiments of the first aspect of the present disclosure.

In the light-emitting device and the display apparatus according to the present disclosure, the transparent charged particles and the quantum dots that can be driven by the control electric field to migrate between the light-exiting region and the non-light-exiting region are encapsulated in the accommodating cavity of the quantum migrating layer, the light emitted by the backlight source enters the light-exiting region. When there are quantum dots gathered in the light-exiting region, the quantum dots are excited to emit light, and when there is no quantum dot in the light-emitting region, the light emitted by the backlight source directly exits through the light-exiting region and emits red, green or blue light. This achieves a selective light emission of two colors for a single sub-pixel, improving utilization of each sub-pixel, and thereby increasing a pixel density of the display apparatus.

BRIEF DESCRIPTION OF DRAWING(S)

DETAILED DESCRIPTION OF EMBODIMENTS

Figure 1:
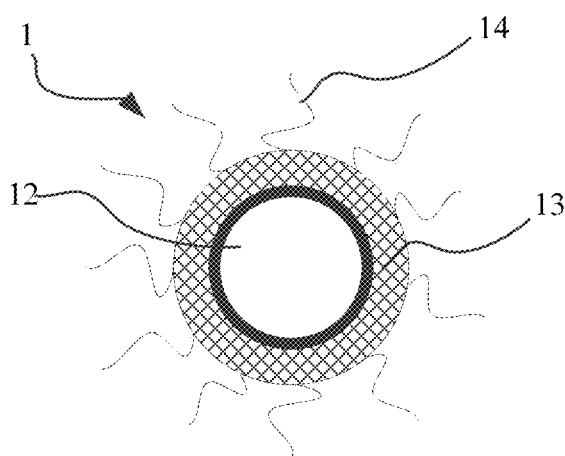
FIG. 1 is a schematic structural diagram of a quantum dot according to an embodiment of the present disclosure.

In order to make the purpose, technical solutions and advantages of embodiments of the present disclosure more clear, the technical solutions of the embodiments of the present disclosure will be described clearly and completely below in combination with the accompany drawings in the embodiments of the present disclosure. Obviously, the described embodiments are merely some rather than all of embodiments of the present disclosure. All other embodiments obtained by those ordinary skilled in the art on the basis of the embodiments of the present disclosure without any inventive effort fall into the protective scope of the present disclosure.

A plurality of pixel units may be disposed in a quantum dot electroluminescent device. Each of the pixel units includes a backlight source, a red quantum dot layer for emitting red light, a green quantum dot layer for emitting green light and a blue quantum dot layer for emitting blue light. The three quantum dot layers emitting three colors of light may be paved in the same layer on a light-exiting path of the backlight source, and are equivalent to be used as an optical filter. By selectively controlling ON and OFF of each quantum dot layers corresponding to the backlight source, one quantum dot layer receives light irradiation to be excited to emit light, while the other two quantum dot layers receive no light irradiation and thus do not emit light, thereby achieving a selective light emission of sub-pixels with different colors in a light-emitting unit, and thus enabling a display apparatus to display different colors of light.

However, during use of the aforementioned quantum dot electroluminescent device, it is easy to appear the problem of low pixel density (Pixels Per Inch, abbreviated as PPI) of the display apparatus.

In various structures of the light-emitting device and the display apparatus disclosed in the present disclosure, quantum dots in use mainly include those quantum dots that can emit red light after being excited, quantum dots that can emit green light after being excited and quantum dots that can emit blue light after being excited according to their size and compositions. Before explaining structures of various embodiments of the present disclosure, the quantum dots in the following various embodiments are explained firstly.

In the embodiments of the present disclosure, the quantum dot is a kind of a nanoparticle, which can be understood as a semiconductor structure with a nanometer unit size. Each of the quantum dots generally has a diameter in the ranges of 2-20 nm, and the quantum dots can emit light with different wavelengths according to changes in size and shape, and the light with different wavelengths corresponds to different colors including, for example, red, green and blue. Where, a quantum dot emitting red light has a size (or diameter) of about 18-20 nm, a quantum dot emitting green light has a size (or diameter) of about 12-14 nm, and a quantum dot emitting blue light has a size (or diameter) of about 6-8 nm. For convenience of description, the quantum dot emitting red light is referred to as a red quantum dot, the quantum dot emitting green light is referred to as a green quantum dot, and the quantum dot emitting blue light is referred to as a blue quantum dot below.

FIG. 1 is a schematic structural diagram of a quantum dot according to an embodiment of the present disclosure. This embodiment of the present disclosure provides a quantum dot 1, which mainly includes a core 12, a shell layer 13 and a modifying group 14, as shown in FIG. 1.

The core 12 of the present embodiment may be formed by a nanocrystal having semiconductor properties and composed of an element from II-VI group or III-V group of the periodic table of elements. The core 12 has a special energy brand gap according to the size and composition thereof, absorbing and emitting light with an inherent wavelength. For example, the core 12 is composed of a compound, for example one of CdS, CdSe, CdTe, ZnS, ZnSe, ZnTe, GaAs, GaP, GaAs, GaSb, HgS, HgSe, HgTe, InAs, InP, InSb, ALAs, AlP and AlSb, or a mixture of three or four or more of the aforementioned materials. The shell layer 13 formed outside the core 12 is used to prevent a change of the core 12 in chemical properties.

In the present embodiment, the shell layer 13 may be an inorganic oxide, such as SiO, TiO, ZnO, silicon dioxide or MgO, so as to ensure insulation properties of components of the shell layer 13 and the core 12. Optionally, the shell layer 13 may also adopt a wide energy gap material that is in the same group as a material of the core 12 and has a high crystal lattice matching degree. For example, optionally, when CdSe is used as the material of nucleus 12, CdS or $CdSe_xS_{1-x}$ may be used as the material of the shell 13.

In the embodiments of the present disclosure, the modifying group 14 may include a polar ligand containing COOH or $NH_4$, or may include a non-polar ligand containing trioctylphosphine oxide (TOPO). The polar ligand can make the quantum dot 1 have a more stable structure.

Generally, a light-emitting unit needs to emit three colors of light, i.e., red, green and blue. Generally, quantum dots of the three colors are fixed and paved above the backlight source and used as three sub-pixels, and the light emission of the quantum dots of three colors is controlled by controlling on and off of the backlight source below, so that a light emission control of the three sub-pixels is achieved. However, for this structure, it is undoubted that each light-emitting unit needs to have three types of quantum dots for emitting the three colors of light, which is difficult to reduce a size of a single light-emitting unit and limit PPI of the display apparatus. In order to reduce the size of a single light-emitting unit and improve compactness of the structure of the display apparatus, an embodiment of the present disclosure provides a light-emitting device, which enables each sub-pixel to emit at least two colors of light through a combined action of a quantum migrating layer and the backlight source. This achieves that a single sub-pixel can selectively emit at least two colors of light, improving a utilization rate of each sub-pixel, and thereby improving the pixel density of the display apparatus.

Figure 2:
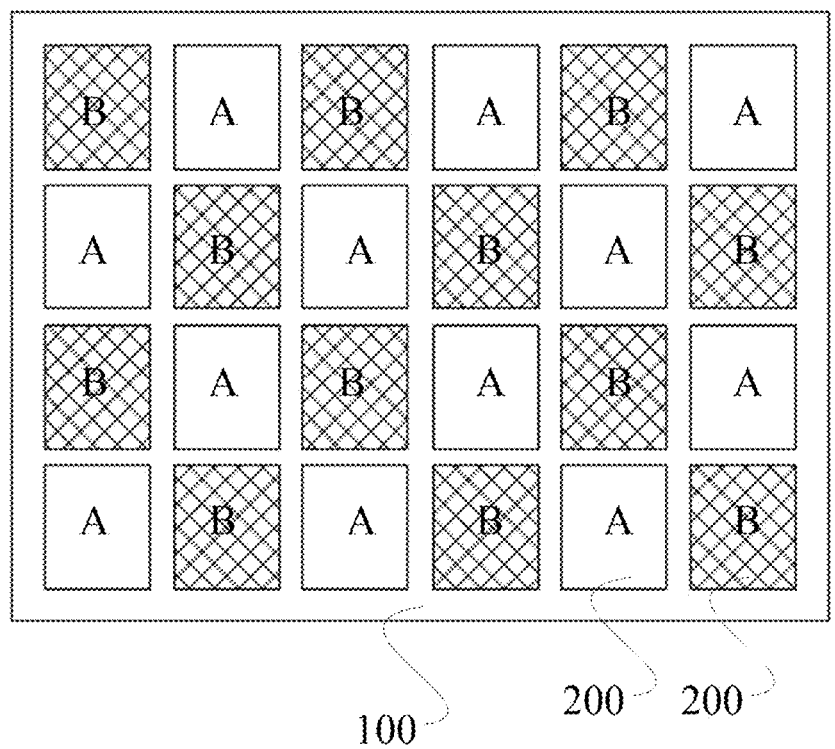
FIG. 2 is a schematic structural diagram of a light-emitting device according to an embodiment of the present disclosure.

FIG. 2 is a schematic structural diagram of a light-emitting device according to an embodiment of the present disclosure. As shown in FIG. 2, the light-emitting device mainly includes an array substrate 100 and a plurality of sub-pixels 200 located on the array substrate 100. The sub-pixels 200 are arranged on the array substrate 100 in an island matrix-type distribution as shown in FIG. 2, but the embodiments of the present disclosure are not limited to this. In the light-emitting device as shown in FIG. 2, each sub-pixel 200 has a structure including the quantum dot and the backlight source. Both the backlight source below a sub-pixel A containing the green quantum dot and the backlight source below a sub-pixel B containing the red quantum dot, as shown in FIG. 2, are backlight sources for emitting blue light, and the backlight sources below the sub-pixels 200 are disposed independently. But colors of the light emitted by the backlight sources of the embodiments of the present disclosure are not limited to the embodiment as shown in FIG. 2.

Figure 3:
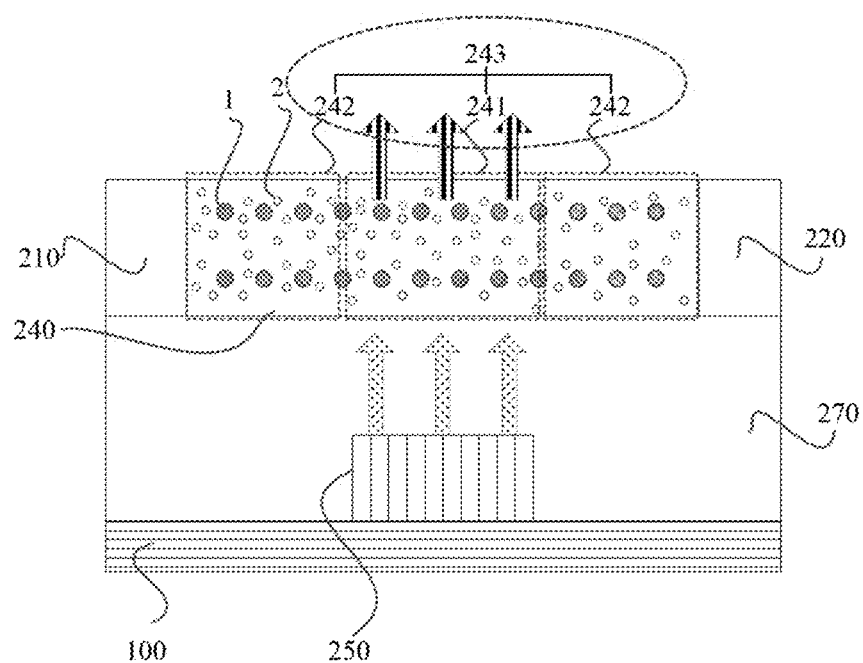
FIG. 3 is a schematic structural diagram of a sub-pixel according to an embodiment of the present disclosure.

FIG. 3 is a schematic structural diagram of a sub-pixel according to an embodiment of the present disclosure. In order to more clearly illustrate a structure of each sub-pixel 200 in the light-emitting device as shown in FIG. 2, the structure of the sub-pixel 200 is explained below in combination with FIG. 3 and specific embodiments.

As shown in FIG. 3, the sub-pixel 200 mainly includes: a first electrode 210, a second electrode 220, a quantum migrating layer 240 and a backlight source 250. The quantum migrating layer 240 is located between the first electrode 210 and the second electrode 220. The first electrode 210 and the second electrode 220 are disposed opposite to each other. In the embodiment, the quantum migrating layer 240 may be understood as a medium layer which has movable transparent charged particles and quantum dots encapsulated therein. Preferably, in an implementation, the first electrode 210, the second electrode 220 and the quantum migrating layer 240 may be disposed in the same layer, as shown in FIG. 3. By applying a voltage to the first electrode 210 and the second electrode 220, a control electric field can be formed. Preferably, the first electrode 210 and the second electrode 220, which are disposed in the same layer with the quantum migrating layer 240, can make the entire quantum migrating layer 240 located in a core range of the control electric field to improve a control effectiveness of the control electric field. In the present embodiment of the present disclosure, the first electrode 210 and the second electrode 220 are used for forming the control electric field in the quantum migrating layer 240, and the structures and arrangements thereof are not limited to the embodiment as shown in FIG. 3.

Continue to refer to FIG. 3, the quantum migrating layer 240 includes a light-exiting region 241 and a non-light-exiting region 242 which are disposed in the same layer. The light-exiting region 241 is a region in the quantum migrating layer 240 that is disposed on a light emitting path of the backlight source 250. And correspondingly, the non-light-emitting region 242 is a region in the quantum migrating layer 240 that is disposed outside the light emitting path of the backlight source 250.

Continue to refer to FIG. 3, the backlight source 250 is disposed corresponding to the light-exiting region 241, so that the light emitted by the backlight source 250 enters the light-exiting region 241 of the quantum migrating layer 240. In an embodiment, the backlight source 250 may be located below the quantum migrating layer 240. In an embodiment, the backlight source 250 may be firstly disposed on the array substrate 100, and the backlight source 250 emits light upward. And then an encapsulation protective layer 270 covering surfaces of the array substrate 100 and the backlight source 250 is formed to fix and protect the backlight source 250. And a material of the encapsulation protective layer 270 is a transparent material without influencing light exiting of the backlight source 250. Finally, the first electrode 210, the second electrode 220 and the quantum migrating layer 240, which are disposed in the same layer or different layers, are formed on the encapsulation protective layer 270, as shown in FIG. 3. As shown in FIG. 3, the backlight source 250 exactly faces the light-exiting region 241 of the quantum migrating layer 240. A projection of the backlight source 250 on the quantum migrating layer 240 is a surface of the light-exiting region 241 facing the backlight source 250. Or it can be understood as that, a size of a surface of the light-exiting are 241 of the quantum migrating layer 240 close to the backlight source 250 is the same as a size of an upper light emitting surface (close to the quantum migrating layer 240) of the backlight source 250.

As shown in FIG. 3, an accommodating cavity 243 is disposed in the quantum migrating layer 240, and transparent charged particles 2 and quantum dots 1, which can migrate in the light-exiting region 241 and the non-light-exiting region 242, are encapsulated in the accommodating cavity 243. In an embodiment, the accommodating cavity 243 is filled with a matrix. The matrix serves as a solvent. The matrix has the transparent charged particles 2 and the quantum dots 1 added thereto. The added transparent charged particles 2 may be absorbed on the surface of the quantum dots 1 or surround the quantum dots 1 without being adsorbed, so that when the transparent charged particles 2 are driven by an electric field to move, they drive the quantum dots 1 to move together in the matrix, to realize the migration of the quantum dots 1. There are mainly two modes for the transparent charged particles 2 to drive the quantum dots 1 to move to realize the migration of the quantum dots 1.

In one mode, each quantum dot 1 has the transparent charged particles 2 absorbed on the surface thereof. When the control electric field is applied to the quantum migrating layer 240, the transparent charged particles 2 perform electrophoretic motion under the force of the electric field. Each quantum dot 1 is pulled by the transparent charged particles 2 absorbed on its surface and migrate towards an electrophoretic direction.

In the other mode, each quantum dot 1 is surrounded by a large number of un-adsorbed transparent charged particles 2, these transparent charged particles 2 move freely, and can perform electrophoretic motion when the control electric field is applied to the quantum migrating layer 240. When a large number of transparent charged particles 2 move towards the same electrophoretic direction, collisions occur between the quantum dot 1 and the transparent charged particles 2 around it, and forces generated by the collisions also push the quantum dot 1 towards the electrophoretic direction. It can be understood as that a large number of the transparent charged particles 2 carry the quantum dot 1 within them to move together.

The aforementioned two modes coexist, rather than exist in isolation. Therefore, with the assistance of the transparent charged particles 2, the quantum dot 1 is driven by the control electric field to migrate between the light-exiting region 241 and the non-light-exiting region 242. A combination of the aforementioned two driving modes of the transparent charged particles 2 to improve a migration speed of the quantum dot 1, thereby improving a refresh frequency of the light-emitting device.

In an embodiment, a material of the matrix can be determined according to a material of the modifying group 14 of the quantum dot 1 therein. For example, if the modifying group 14 of the quantum dot 1 includes a polar ligand containing COOH or $NH_4$, then the matrix may use an alcohol solvent, such as ethanol. If the modifying group 14 of the quantum dot 1 includes a non-polar ligand, such as TOPO, then the matrix may use an alkane solvent, such as n-heptane or n-octane.

Figure 4:
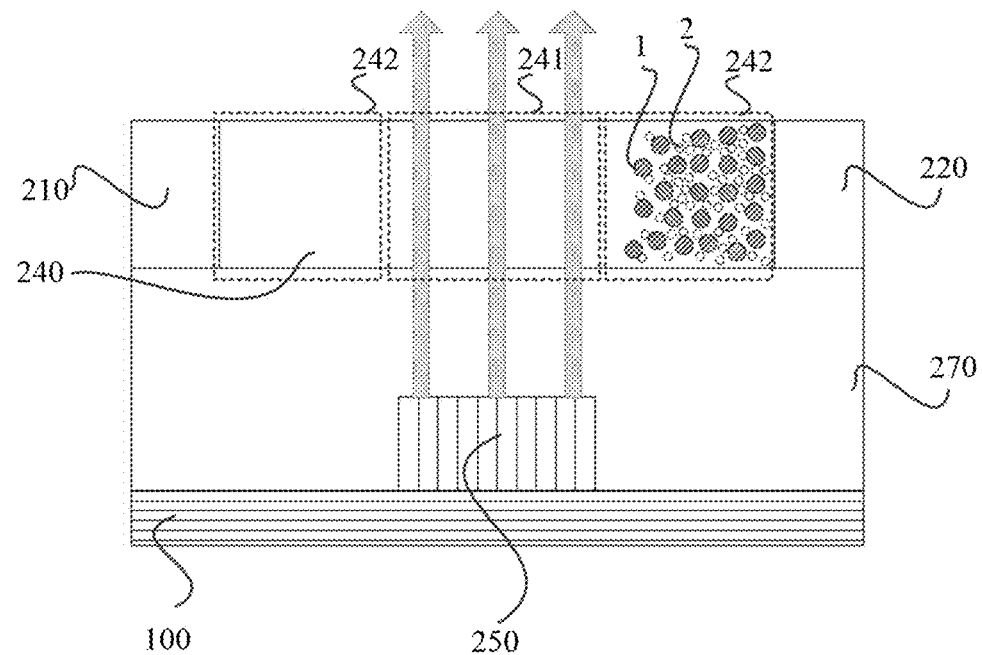
FIG. 4 is a schematic diagram of complete light output of the sub-pixel as shown in FIG. 3 from a backlight source.

FIG. 4 is a schematic diagram of complete light output of the sub-pixel as shown in FIG. 3 from a backlight source according to an embodiment of the present disclosure. The color of the light emitted by the backlight source 250 is any one of red, green and blue. The backlight source 250 emitting blue light and green quantum dots 1 will be taken as an example for illustration in the structures as shown in FIG. 3 and FIG. 4 and the following embodiments. There is a similar principle for the backlight source 250 emitting other color light and other color quantum dots.

In the structures as shown in FIG. 3 and FIG. 4, the light-exiting region 241 is disposed in a middle position of the quantum migrating layer 240, and two non-light-exiting regions 242 are disposed between one side of the light-exiting region 241 and the first electrode 210 and between the other side of the light-exiting region 241 and the second electrode 220, respectively.

Referring to FIG. 3, when the sub-pixel 200 needs to be displayed green, controlling voltages of the first electrode 210 and the second electrode 220 so that the green quantum dots 1 in the quantum migrating layer 240 are evenly distributed, especially compactly arranged in the light-exiting region 241. Since the quantum dots 1 have a sufficiently small particle diameter, they can completely shield the backlight source 250 below them when uniformly distributed. Blue light emitted by the backlight source 250 is absorbed by the green quantum dots 1 in the light-exiting region 241, and the green quantum dots 1 emit green light, and the green light exits from the light-exiting region 241, thereby achieving a green display of the sub-pixel 200. Referring to FIG. 4, when the sub-pixel needs to be displayed blue, controlling voltages of the first electrode 210 and the second electrode 220 so that the green quantum dots 1 in the quantum migrating layer 240 are migrated and gathered to a side at which the first electrode 210 is located or a side at which the second electrode 220 is located, thereby forming a "window" in the light-exiting region 241. Due to the above mentioned two driving effects of the transparent charged particles 2 on the quantum dots 1, it can be ensured that the green quantum dots 1 in the light-exiting region are completely removed under the action of the control electric field. In this case, the blue light emitted by the backlight source 250 can directly exits through the light-exiting region 241, thereby achieving a blue display of the sub-pixel 200. It can be seen that, in the present embodiment, one sub-pixel 200 can achieve two-color light emission, which improve the utilization rate of a single sub-pixel 200, and thereby improving the PPI and a resolution per unit area of the light emitting device.

Optionally, as shown in FIG. 3 and FIG. 4, the light-exiting region may be disposed in the middle position of the quantum migrating layer 240 or may be disposed in an edge area adjacent to the first electrode 210 or the second electrode 220. For example, an end of the quantum migrating layer 240 close to the first electrode 210 is the light-exiting region 241, and another end of the quantum migrating layer 240 close to the second electrode 220 is the non-light-exiting region 242. The backlight source 250 is disposed below the light-exiting region 241. A position of the light-exiting region 241 should be selected according to a practical situation and positions and shapes of the first electrode 210 and the second electrode 220, and the present disclosure does not limit this herein.

In the embodiments shown in FIG. 3 and FIG. 4, there are many ways to control voltages of the first electrode 210 and the second electrode 220 to enable the quantum dots 1 to enter or depart from the light-exiting region 241. An optional way may be connecting the first electrode 210 to a negative pole of a power supply and connecting the second electrode 220 to a positive pole of the power supply, and when the transparent charged particles 2 are negatively charged, a driving effect as shown in FIG. 4 is formed. The transparent charged particles 2 carry the quantum dots 1 to move right to enable all quantum dots 1 to migrate into the non-light-exiting region 242 close to a side at which the second electrode 220 is located and achieve a direct light emission of the backlight source 250 (assumed to emit blue light), that is the sub-pixel displays blue. Then the two poles of the power supply connected with the first electrode 210 and the second electrode 220 are exchanged, i.e. the first electrode 210 is connected to the positive pole of the power supply and the second electrode 220 is connected to the negative pole of the power supply to enable the transparent charged particles 2 to carry the quantum dots 1 to move left. When the quantum dots 1 completely cover the light-exiting region 241, stop applying voltages to the first electrode 210 and the second electrode 220 or applying voltages at the same potential to the first electrode 210 and the second electrode 220, so that the quantum dots 1 stay within the light-exiting region 241 to block the light emission path of the backlight source 250 and meanwhile absorb the light emitted by the backlight source 250 and emit light. For example, if it is the green quantum dots 1 that block the backlight source 250, then the light-exiting region 241 emits green light, and the sub-pixel 200 displays green.

In the light-emitting device and the display apparatus according to the present disclosure, the sub-pixel 200 on the array substrate 100 has the first electrode 210 and the second electrode 220 that are disposed opposite to each other, and the quantum migrating layer 240 that is located between the first electrode 210 and the second electrode 220 disposed thereon. The first electrode 210 and the second electrode 220 apply the control electric field to the quantum migrating layer 240. The quantum migrating layer 240 includes the non-light-exiting region 242 and the light-exiting region 241 corresponding to the backlight source 250, which and the non-light-exiting region 242 and the light-exiting region 241 are disposed in the same layer. The transparent charged particles 2 and the quantum dots 1, which can be driven by the control electric field to move between the light-exiting region 241 and the non-light-exiting region 242 are encapsulated in the accommodating cavity 243 of the quantum migrating layer 240. The light emitted by the backlight source 250 enters the light-exiting region 241. When the quantum dots 1 are gathered in the light-exiting region 241, the quantum dots 1 are excited to emit light. When there is no quantum dot 1 in the light-exiting region 241, the light emitted by the backlight source 250 directly exits through the light-exiting region 241 and emits red, green or blue light. This achieves a selective light emission of two colors for a single sub-pixel 200 to improve the utilization rate of each sub-pixel 200, and thereby improving the pixel density of the display apparatus.

In order to ensure that each sub-pixel 200 can display at least two colors, the type of the quantum dots 1 in the quantum migrating layer 240 may be selected in the following manner: a color of light emitted by the quantum dots 1 may be any one of red, green and blue, while the color of the light emitted by the quantum dots 1 should be different from a color of light emitted by the backlight source 250. The backlight source 250 here refers to a backlight source in the same sub-pixel 200 as the quantum dots 1. For example, in the light-emitting device as shown in FIG. 2, backlight sources 250 of all sub-pixels 200 are selected to be blue backlight sources, and in the sub-pixel A containing green quantum dots, the quantum dots 1 encapsulated in the quantum migrating layer 240 are green quantum dots, while in the sub-pixel B containing red quantum dots, the quantum dots 1 encapsulated in the quantum migrating layer 240 are red quantum dots. Then in FIG. 2, the sub-pixel A containing green quantum dots are used to display blue and green colors, while the sub-pixel B containing red quantum dots is used to display blue and red colors. Similarly, the backlight sources 250 may also be backlight sources for emitting red light or green light, and in this case, the type of the quantum dots 1 in the quantum migrating layer 240 may be selected in the same manner as above-mentioned.

In order to improve the migration rate of quantum dots 1, on the basis of the above-mentioned embodiments, an surfactant may be added into the quantum migrating layer 240 to increase binding probability between the transparent charged particles 2 and the quantum dots 1, so that more transparent charged particles 2 are bound onto the surface of each quantum dot 1. Optionally, the surfactant may include various surfactants such as an anionic surfactant, a cationic surfactant, a zwitterionic surfactant, a nonionic surfactant, or a chiral surfactant. Specifically, the surfactant may be, for example SDS, or cetyltrimethylamine.

In an embodiment, the above-mentioned transparent charged particles 2 are preferably a surface-modified metal oxide nanoparticle. The surface-modified metal oxide nanoparticles have a particle diameter of greater than or equal to 10 nm and less than or equal to 100 nm, so that the metal oxide nanoparticles can suspend more stably in the solvent, in a form of colloidal particles, to avoid aggregation and deposition.

The aforementioned surface-modified metal oxide nanoparticle may be any one of the following selectable materials or a combination of two or more thereof.

An optional material is a tungsten oxide, represented by a general formula $W_{y1}O_{z1}$, where y1 and z1 satisfy $2.2 \leq z1/y1 \leq 2.999$. Tungsten trioxide ($WO_3$) has an excellent visible light transmittance, but has no efficient conductive electrons (free electrons), and thus the value of z1/y1 is set to 2.999 or less. A surface of the tungsten oxide is modified, which enables the tungsten oxide to have effective free electrons and become a conductive material, and which can ensure the value of z1/y1 is 2.2 or more to avoid an appearance of a $WO_2$ crystal phase other than $W_{y1}O_{z1}$ in the surface-modified metal oxide nanoparticles and ensure a chemical stability of the surface-modified metal oxide nanoparticles.

Another optional material is a composite tungsten oxide represented by a general formula $M_{x2}W_{y2}O_{z2}$ and having a hexagonal crystal structure, where M is one selected from a group consisting of H, He, an alkali metal, an alkaline earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I, where x2, y2 and z2 satisfy $0.001 \leq x2/y2 \leq 1.1$ and $2.2 \leq z2/y2 \leq 2.999$. In this selective material, conductive electrons are formed by adding element M. The more the element M is added, the more the conductive electrons are supplied.

Still another optional material is an indium antimony oxide (abbreviated as IAO).

Yet another optional material is an indium tin oxide (abbreviated as ITO).

The aforementioned several materials used in the present embodiment have a wide brand gap to keep a good light transmittance in the visible light range. In the present embodiment, the conductive electrons are generated by reducing an oxygen content of the oxides or adding cations to charge the particles. At the same time, the particle size or shape of the aforementioned surface-modified metal oxide nanoparticles is controlled to obtain the transparent charged particles 2 that can be transmitted by visible light and have a conductive performance.

Figure 5:
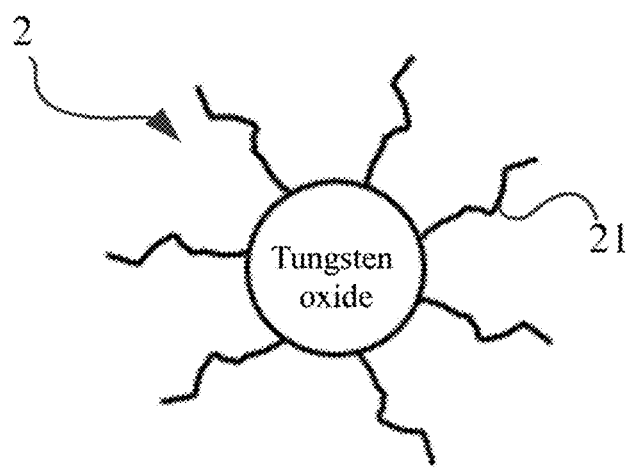
FIG. 5 is a schematic structural diagram of a transparent charged particle according to an embodiment of the present disclosure.

FIG. 5 is a schematic structural diagram of a transparent charged particle according to an embodiment of the present disclosure. As shown in FIG. 5, the transparent charged particles 2 may be particles coated with a polar ligand 21 on their surfaces. For example, for the surface-modified metal oxide nanoparticles, their surfaces may be combined with the polar ligand 21, to achieve a surface coating by the polar ligand 21, thereby providing the conductive performance and meanwhile preventing the transparent charged particles 2 from agglomerating with each other. In FIG. 5, the surface-modified metal oxide nanoparticles in the transparent charged particles 2 being tungsten oxide is taken as an example. But the transparent charged particle 2 is not limited to this structure, and it can also be made of other aforementioned optional materials. Preferably, the polar ligand 21 includes one selected from a group consisting of $NH_4$, a sulfonate group ($SO_3H$), COOH and a halogen, which can improve stability of the transparent charged particles 2.

Figure 6:
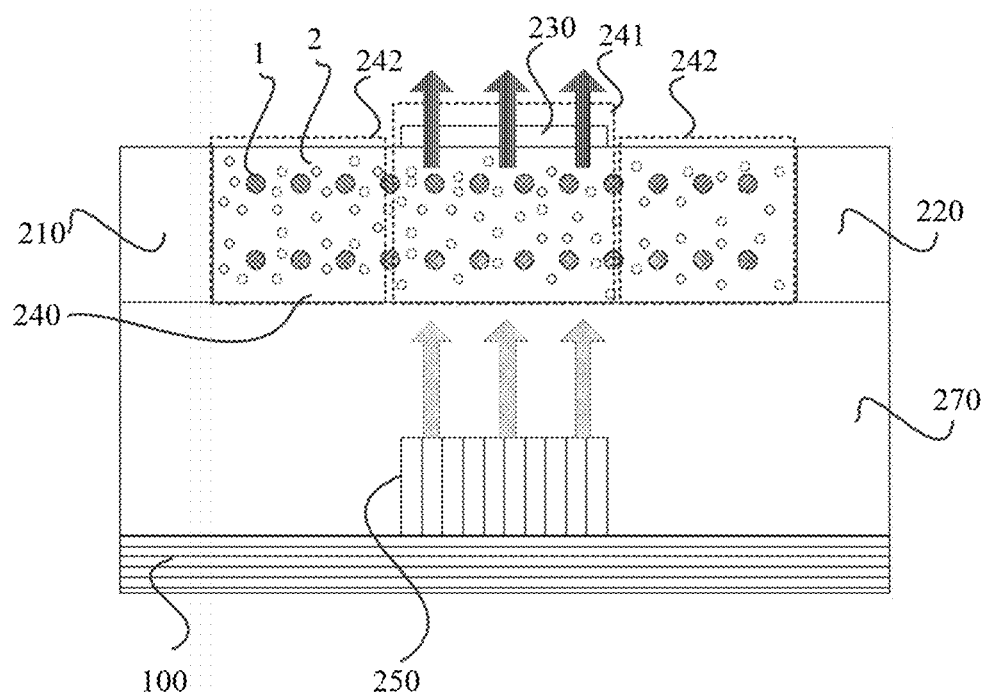
FIG. 6 and FIG. 6A are schematic structural diagrams of another sub-pixel according to embodiments of the present disclosure.
Figure 7:
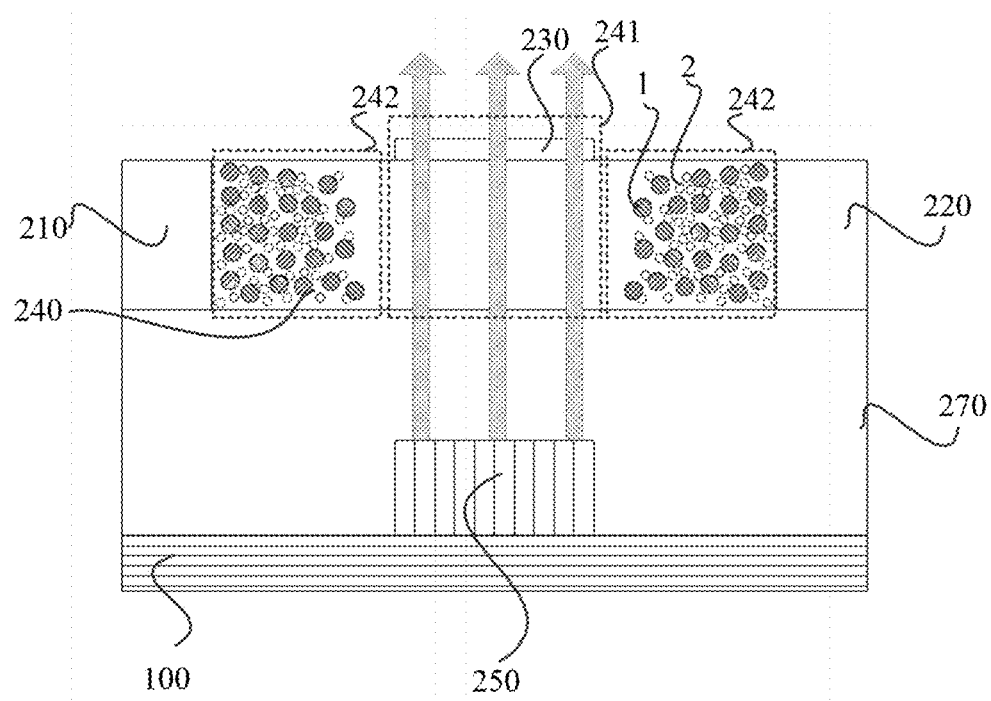
FIG. 7 is a schematic diagram of complete light output of the sub-pixel as shown in FIG. 6 from a backlight source.

In the embodiments as shown in FIG. 3 and FIG. 4, during migration of the quantum dots 1 from covering the light-exiting region 241 to being completely gathered in the non-light-exiting region 242, a maximum migration stroke of the quantum dots 1 is a transverse width of the entire quantum migrating layer 240. By reducing the maximum migration stroke of the quantum dots 1, the migrating time of the quantum dots 1 can be shortened, thereby increasing the refreshing frequency of the light-emitting device. FIG. 6 is a schematic structural diagram of another sub-pixel according to an embodiment of the present disclosure. FIG. 7 is a schematic diagram of a completely emission of complete light output of the sub-pixel as shown in FIG. 6 from a backlight source. The sub-pixel 200 as shown in FIG. 6 further includes a third transparent electrode 230 that is located between the first electrode 210 and the second electrode 220. The third transparent electrode 230 and the first electrode 210 form a control electric field (a first control electric field), and the third transparent electrode 230 and the second electrode 220 form another control electric field (a second control electric field). The aforementioned two electric fields have contrary directions. The third transparent electrode 230 may be an indium-tin oxide (abbreviated as ITO) electrode, or an electrode made of other transparent conductive material.

It is assumed that the transparent charged particles 2 are negatively charged, the green quantum dots 1 are disposed in the quantum migrating layer, the backlight source 250 emits blue light, and the light-exiting region 241 as shown in FIG. 6 is disposed exactly below the third transparent electrode 230. When the sub-pixel 200 needs to be displayed green, the first electrode 210 and the second electrode 220 are connected with the negative pole of the power supply, and the third transparent electrode 230 is connected with the positive pole of the power supply, so that the green quantum dots 1 in the quantum migrating layer 240 migrate with the transparent charged particles 2 to the third transparent electrode 230, and finally gather in the light-exiting region 241 below the third transparent electrode 230 and completely shield the backlight source 250, as shown in FIG. 6. At this time, the blue light emitted by the backlight source 250 is absorbed by the green quantum dots 1 in the light-exiting region 241, and the green quantum dots 1 emit green light, and the green light exits from the light-exiting region 241, thereby achieving a green display of the sub-pixel 200. When the sub-pixel 200 needs to be displayed blue, the first electrode 210 and the second electrode 220 are connected with the positive pole of the power supply, and the third transparent electrode 230 is connected with the negative pole of the power supply, so that the green quantum dots 1 in the quantum migrating layer 240 are migrated and gathered to a side at which the first electrode 210 is located and a side at which the second electrode 220 is located, and thus forms a "window" in the light-exiting region 241 below the third transparent electrode 230, as shown in FIG. 7. Due to the third transparent electrode 230 added between the first electrode 210 and the second electrode 220, the maximum migration stroke of the quantum dots 1 is reduced by half, which shortens the time for the quantum dots 1 to completely migrate out of the light-exiting region 241. At the same time, in the case of using the same voltage, an introduction of the third transparent electrode 230 can increase an intensity of the electric field in the quantum migrating layer 240, which increases a traction force for each quantum dot 1 and a conversion speed between displaying green and displaying blue of the sub-pixel 200, and thereby improving a refresh frequency of the light-emitting device.

Figure 6A:
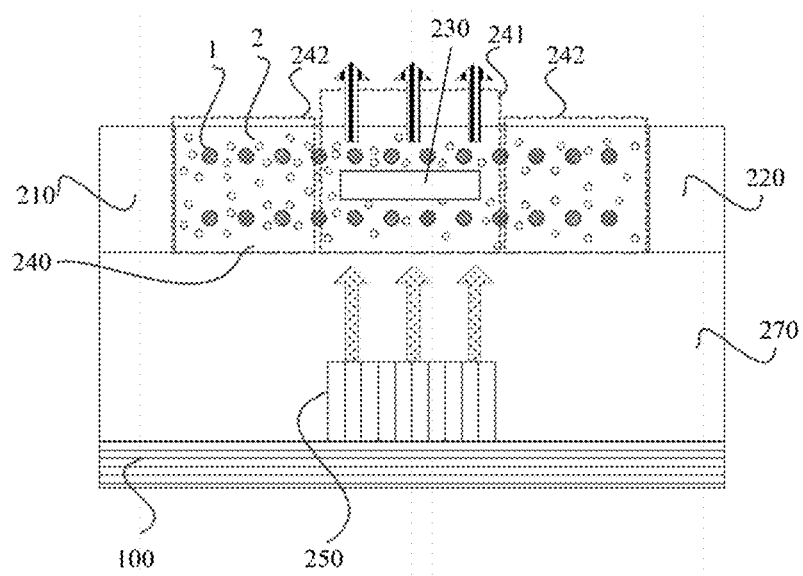

Optionally, the third transparent electrode 230 may be located on the surface of the quantum migrating layer 240 to cover at least part of the light-exiting region 241. As shown in FIG. 6A, the third transparent electrode 230 may also be embedded in the quantum migrating layer 240, thereby forming a transverse control electric field in the quantum migrating layer 240 and improving a control efficiency of the electric field.

Figure 8:
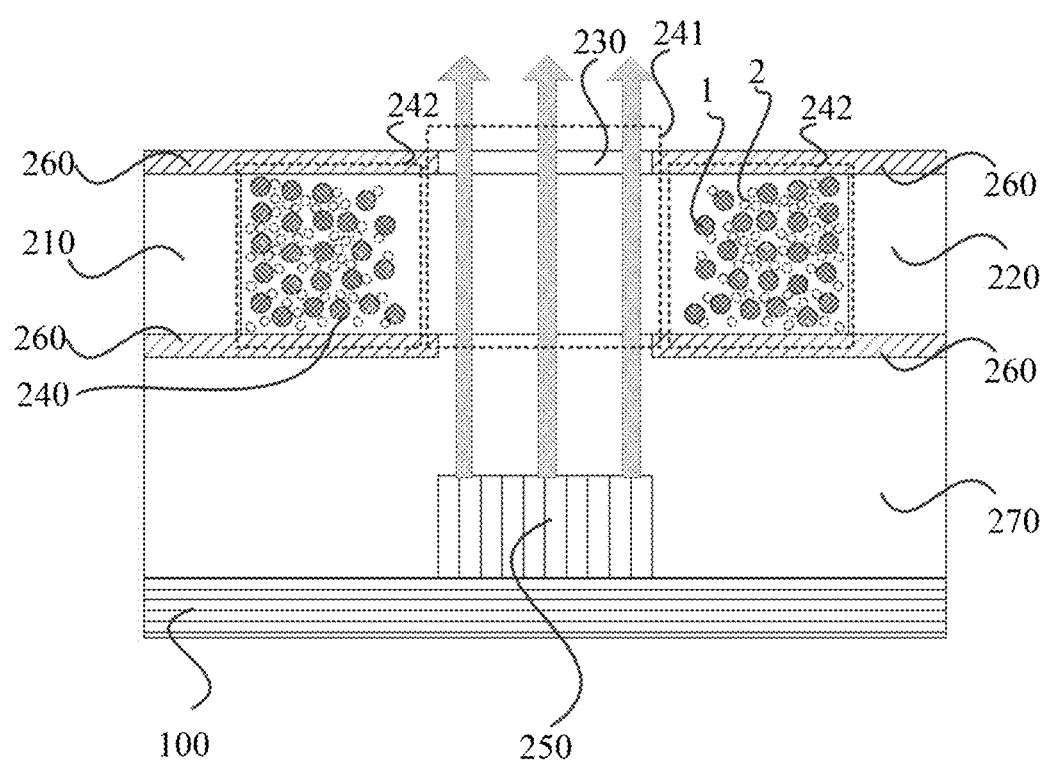
FIG. 8 is a schematic structural diagram of further another sub-pixel according to an embodiment of the present disclosure.

FIG. 8 is a schematic structural diagram of further another sub-pixel according to an embodiment of the present disclosure. In the case of the backlight source 250 emitting light, for example in the case of the aforementioned emitting blue light, it may be that part of the quantum dots 1 in the non-light-exiting region 242 is close to the light-exiting region 241 or part of the light emitted by the backlight source 250 is refracted or scattered into the non-light-exiting region 242, which causes the quantum dots 1 in the non-light-exiting region to be excited and emit light and thus causes the sub-pixel 200 to display impure colors. As shown in FIG. 8, in order to decrease the possibility of the sub-pixel 200 displaying impure colors, the sub-pixel 200 of the present embodiment may further include a light blocking layer 260 that is located on a surface of the quantum migrating layer 240 and covers the non-light-exiting region 242. The light blocking layer 260 is located on a surface of the quantum migrating layer 240 close to the backlight source 250 and/or a surface of the quantum migrating layer 240 away from the backlight source 250. When the light blocking layer 260 is located on the surface of the quantum migrating layer 240 close to the backlight source 250, before the light emitted by the backlight source 250 enters the quantum migrating layer 240, part of stray light entering the non-light-exiting region 242 is removed by the light blocking layer 260, so that the light emitted by the backlight source 250 enters the quantum migrating layer 240 merely by the light-exiting region 241. When the light blocking layer 260 is located on the surface of the quantum migrating layer 240 away from the backlight source 250 and the quantum dots 1 can emit light (for example green light) in the non-light-exiting region, the light blocking layer 260 can prevent the light being emitted by the quantum dots 1 from exiting, so that the light exits merely through the light-exiting region 241 of the quantum migrating layer 240. Therefore, the light blocking layer 260 may be disposed on the surface of the quantum migrating layer 240 close to the backlight source 250, or the surface of the quantum migrating layer 240 away from the backlight source 250, or may be simultaneously disposed on the surface of the quantum migrating layer 240 close to the backlight source 250 and the surface of the quantum migrating layer 240 away from the backlight source 250.

The embodiments of the present disclosure also provide a display apparatus including the light-emitting device as described in any one of the aforementioned embodiments. The display apparatus according to the present embodiment may be a display panel, or a display screen including a display panel, or a computer system or a terminal device including a display screen, and the like.

The aforementioned embodiments are only used to illustrate the technical solutions of the present disclosure, but shall not to limit them. Although the present disclosure has been described in detail with reference to the foregoing embodiments, those ordinary skilled in the art should understand that they can still modify the technical solutions described in the foregoing embodiments, or equivalently replace some or all of the technical features therein. However, these modifications or replacements do not make the essence of corresponding technical solutions depart from the scope of the technical solutions of various embodiments of the present disclosure.

What is claimed is:

1. A light-emitting device, comprising an array substrate and a plurality of sub-pixels disposed on the array substrate, wherein each of the sub-pixels comprises:
   a first electrode;
   a second electrode, disposed corresponding to the first electrode;
   a quantum migrating layer, located between the first electrode and the second electrode and comprising a light-exiting region and a non-light-exiting region arranged in a same layer; and
   a backlight source, disposed between the array substrate and the quantum migrating layer, corresponding to the light-exiting region, and light emitted by the backlight source entering the light-exiting region;
   wherein an accommodating cavity is disposed in the quantum migrating layer, transparent charged particles and quantum dots are encapsulated in the accommodating cavity, the transparent charged particles and the quantum dots are added in a liquid matrix, are enabled to migrate in the light-exiting region and the non-light-exiting region, and the transparent charged particles are adsorbed on surfaces of the quantum dots and each quantum dot is absorbed with multiple transparent charged particles.

2. The light-emitting device according to claim 1, wherein a color of light emitted by the quantum dots is any one of red, green and blue, and the color of the light emitted by the quantum dots is different from a color of the light emitted by the backlight source.

3. The light-emitting device according to claim 1, wherein the transparent charged particles are surface-modified metal oxide nanoparticles, and each of the surface-modified metal oxide nanoparticles has a particle diameter of greater than or equal to 10 nm and less than or equal to 100 nm.

4. The light-emitting device according to claim 3, wherein each of the surface-modified metal oxide nanoparticles comprises:
   a tungsten oxide, represented by a general formula $W_{y1}O_{z1}$, wherein y1 and z1 satisfy $2.2 \leq z1/y1 \leq 2.999$; and/or
   a composite tungsten oxide, represented by a general formula $M_{x2}W_{y2}O_{z2}$ and having a hexagonal crystal structure, wherein M is one selected from a group consisting of H, He, an alkali metal, an alkaline earth metal, a rare earth element, Mg, Zr, Cr, Mn, Fe, Ru, Co, Rh, Ir, Ni, Pd, Pt, Cu, Ag, Au, Zn, Cd, Al, Ga, In, Tl, Si, Ge, Sn, Pb, Sb, B, F, P, S, Se, Br, Te, Ti, Nb, V, Mo, Ta, Re, Be, Hf, Os, Bi and I, wherein x2, y2 and z2 satisfy $0.001 \leq x2/y2 \leq 1.1$ and $2.2 \leq z2/y2 \leq 2.999$; and/or,
   an indium antimony oxide; and/or
   an indium tin oxide.

5. The light-emitting device according to claim 4, wherein each of the surface-modified metal oxide nanoparticles has a surface coated with a polar ligand, and the polar ligand comprises one of $NH_4$, $SO_3H$, COOH and a halogen.

6. The light-emitting device according to claim 1, wherein each of the sub-pixels further comprises:
   a third transparent electrode, located between the first electrode and the second electrode, wherein a first control electric field is formed between the third transparent electrode and the first electrode, a second control electric field is formed between the third transparent electrode and the second electrode, and the first control electric field and the second control electric field are in contrary directions.

7. The light-emitting device according to claim 6, wherein the third transparent electrode is located on a surface of the quantum migrating layer, and at least partially covers the light-exiting region.

8. The light-emitting device according to claim 6, wherein the third transparent electrode is embedded in the quantum migrating layer, and at least partially covers the light-exiting region.

9. The light-emitting device according to claim 1, wherein each of the sub-pixels further comprises:
   a light blocking layer, located on a surface of the quantum migrating layer and covering the non-light-exiting region.

10. The light-emitting device according to claim 9, wherein the light blocking layer is located on a surface of the quantum migrating layer close to the backlight source and/or a surface of the quantum migrating layer away from the backlight source.

11. The light-emitting device according to claim 1, wherein the quantum migrating layer has a surfactant added thereto.

12. The light-emitting device according to claim 1, wherein each of the quantum dots comprises a core, a shell layer and a modifying group.

13. The light-emitting device according to claim 1, wherein the light-exiting region is disposed in a middle position of the quantum migrating layer.

14. A display apparatus, comprising the light-emitting device according to claim 1.

15. The light-emitting device according to claim 1, wherein when the transparent charged particles are driven by an electric field to move, the quantum dots are driven by the transparent charged particles to move in the liquid matrix.

16. The light-emitting device according to claim 8, wherein a transverse control electric field is formed in the quantum migrating layer.

* * * * *